United States Patent
An (10) Patent No.: US 8,132,934 B2
(45) Date of Patent: Mar. 13, 2012

(54) LIGHT EMITTING DEVICE AND LIGHT UNIT HAVING THE SAME

(75) Inventor: Joong In An, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/070,616

(22) Filed: Mar. 24, 2011

(65) Prior Publication Data

US 2011/0235363 A1    Sep. 29, 2011

(30) Foreign Application Priority Data

Mar. 26, 2010  (KR) .......................... 10-2010-0027405

(51) Int. Cl.
*F21V 9/00* (2006.01)
(52) U.S. Cl. .................................. 362/231; 362/249.02
(58) Field of Classification Search ............... 362/84, 362/293, 230, 231, 249.02; 257/99, 100; 313/498, 502
See application file for complete search history.

(56) References Cited

U.S. PATENT DOCUMENTS

| | | | | |
|---|---|---|---|---|
| 7,066,623 B2* | 6/2006 | Lee et al. | ...................... | 362/230 |
| 7,206,507 B2* | 4/2007 | Lee et al. | ...................... | 396/182 |
| 2003/0063062 A1* | 4/2003 | Tsumura et al. | ............... | 345/102 |
| 2006/0120077 A1* | 6/2006 | Yoon et al. | ..................... | 362/231 |
| 2009/0262515 A1* | 10/2009 | Lee et al. | ......................... | 362/84 |

FOREIGN PATENT DOCUMENTS

| | | |
|---|---|---|
| JP | 2006-352030 A | 12/2006 |
| JP | 2008-305992 A | 12/2008 |
| KR | 10-2008-0070270 A | 7/2008 |
| KR | 10-0891810 B1 | 3/2009 |

OTHER PUBLICATIONS

Korean Decision to Grant a Patent dated Oct. 27, 2010 issued in Application No. 10-2010-0027405.

* cited by examiner

*Primary Examiner* — Thomas Sember
(74) *Attorney, Agent, or Firm* — KED & Associates LLP (57) ABSTRACT

Disclosed are a light emitting device and a light unit having the same. The light emitting device includes a body; a first light emitting diode for emitting a light having a first main peak in a wavelength range of a first color; a second light emitting diode for emitting a light having a second main peak in the wavelength range of the first color; and a plurality of lead electrodes electrically connected to at least one of the first and second light emitting diodes on the body. The first main peak of the first light emitting diode and the second main peak of the second light emitting diode have a wavelength difference of at least 75% based on the wavelength range of the first color.

13 Claims, 8 Drawing Sheets

| Wd\Mix | W1 | W2 | W3 | W4 | W5 | W6 | W7 | W8 |
|---|---|---|---|---|---|---|---|---|
| M1 | A1 |    |    |    |    |    |    | A2 |
| M2 |    | B1 |    |    |    |    | B2 |    |
| M3 |    |    | C1 |    |    | C2 |    |    |
| M4 |    |    |    | D1 | D2 |    |    |    |
| M5 |    |    |    | E1 | E2 |    |    |    |
| M6 |    |    | F1 |    |    | F2 |    |    |
| M7 |    | G1 |    |    |    |    | G2 |    |
| M8 | H1 |    |    |    |    |    |    | H2 |

LIGHT EMITTING DEVICE AND LIGHT UNIT HAVING THE SAME

The present application claims priority of Korean Patent Application No. 10-2010-0027405 filed on Mar. 26, 2010, which is hereby incorporated by reference in its entirety.

BACKGROUND

The embodiment relates to a light emitting device and a light unit having the same.

A light emitting diode (LED) may constitute a light source for generating light by using GaAs, AlGaAs, GaN, InGaN, and InGaAlP-based compound semiconductor materials.

Such an LED is packaged so as to be used as a light emitting device that emits lights having various colors. The light emitting device is used as a light source in various products such as a lighting indicator, a character indicator, and an image display.

SUMMARY

The embodiment provides a light emitting device having at least two light emitting diodes.

The embodiment provides a light emitting device including light emitting diodes capable of emitting lights having the same color band and different main peaks.

The embodiment provides a light unit including a plurality of light emitting device employing light emitting diodes capable of emitting lights having wavelength bands with different main peaks.

A light emitting device according to the embodiment includes a body; a first light emitting diode for emitting a light having a first main peak in a wavelength range of a first color; a second light emitting diode for emitting a light having a second main peak in the wavelength range of the first color; and a plurality of lead electrodes electrically connected to at least one of the first and second light emitting diodes on the body, wherein the first main peak of the first light emitting diode and the second main peak of the second light emitting diode have a wavelength difference of at least 75% based on the wavelength range of the first color.

A light emitting device according to the embodiment includes a body having a cavity; a first light emitting diode for emitting a light having a first main peak in a wavelength range of a first color band; a second light emitting diode for emitting a light having a second main peak in the wavelength range of the first color band; a plurality of lead electrodes electrically connected to at least one of the first and second light emitting diodes on the body; and a resin member filled in the cavity, wherein a central peak of the first main peak of the first light emitting diode is closer to a short wavelength than to a central wavelength of the first color band, and a central peak of the second main peak of the second light emitting diode is closer to a long wavelength than to the central wavelength of the first color band.

A light unit according to the embodiment includes a board; and a plurality of light emitting devices arrayed on the board, wherein at least one first light emitting device of the light emitting devices includes a body; a first light emitting diode for emitting a light having a first main peak in a wavelength range of a first color; a second light emitting diode for emitting a light having a second main peak in the wavelength range of the first color; and a plurality of lead electrodes electrically connected to at least one of the first and second light emitting diodes on the body, and wherein the first main peak of the first light emitting diode and the second main peak of the second light emitting diode have a wavelength difference of at least 75% based on the wavelength range of the first color.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 1:
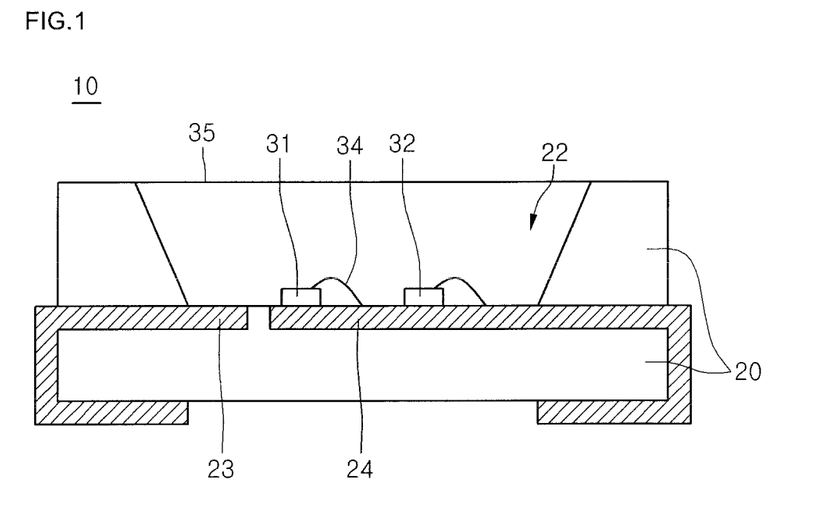
FIG. 1 is a side sectional view showing a light emitting device according to the first embodiment.
Figure 2:
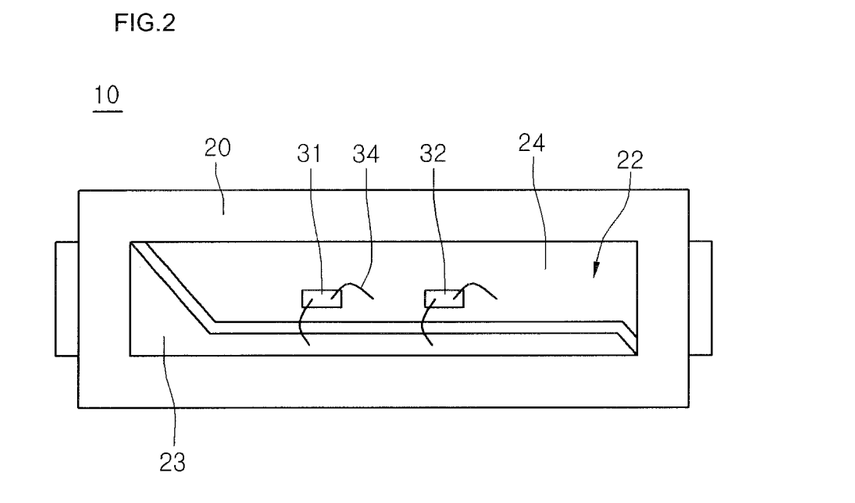
FIG. 2 is a plan view of FIG. 1.

FIG. 1 is a side sectional view showing a light emitting device according to the first embodiment, and FIG. 2 is a plan view of FIG. 1;

Referring to FIGS. 1 and 2, a light emitting device 10 includes a body 20 having a cavity 22 with an opened top surface, a plurality of lead electrodes 23 and 24, light emitting diodes 31 and 32 electrically connected to the lead electrodes 23 and 24, and a resin member 35 filled in the cavity 22.

The body 20 may include one of a silicon material, a ceramic material and a resin material. For instance, the body 20 may include at least one of silicon, silicon carbide (SiC), aluminum nitride (AlN), polyphthalamide (PPA), and liquid crystal polymer (LCP), but the embodiment is not limited thereto. In addition, the body 20 can be prepared or injection-molded as a structure of a single-layer substrate or a multi-layer substrate, but the embodiment does not limit the shape and the structure of the body.

The body 20 is formed at an upper portion thereof with the cavity 22 having the opening. The cavity 22 has a predetermined depth from the top surface of the body 20. The cavity 22 may have a concave cup shape or a concave tube shape having a predetermined curvature. In addition, a top surface of the cavity 22 may have a circular shape or a polygonal shape, but the embodiment is not limited thereto.

An inner wall of the cavity 22 may be inclined toward a bottom surface of the cavity 22 to reflect the incident light toward the opening.

The lead electrodes 23 and 24 are arranged at both sides of the body 20. The lead electrodes 23 and 24 are disposed at the bottom surface of the body 20 to serve as external electrodes.

The lead electrodes 23 and 24 are prepared as a lead frame type, a metal thin film type or a PCB (printed circuit board) pattern type. For the purpose of convenience of explanation, the lead frame type lead electrodes 23 and 24 will be described below.

Referring to FIGS. 1 and 2, the light emitting diodes 31 and 32 are bonded to the second lead electrode 24 by an adhesive and electrically connected to the lead electrodes 23 and 24 by using a plurality of wires 34. The light emitting diodes 31 and 32 can be mounted by selectively using a die bonding scheme employing at least one wire or an adhesive, and a flip bonding scheme for reverse bonding of a chip. Such a bonding scheme may be selected according to the type of LED chips and the position of the electrode.

The light emitting diodes 31 and 32 can be connected to the lead electrodes 23 and 24 in series or parallel, but the embodiment is not limited thereto. The light emitting diodes 31 and 32 may selectively include a semiconductor device manufactured by using a compound semiconductor, such as AlInGaN, InGaN, GaN, GaAs, InGaP, AlInGaP, InP, or InGaAs.

In addition, the light emitting diodes 31 and 32 may include a blue LED chip, a yellow LED chip, a green LED chip, a red LED chip, a UV (ultraviolet) LED chip, a pumpkin-color LED chip, or a blue-green LED chip. Further, the number and type of the light emitting diodes 31 and 32 disposed in the light emitting device 10 can be changed and the light emitting diodes 31 and 32 may emit the light having the same color.

The resin member 35 is filled in the cavity 22. The resin member 35 may include a transparent resin material, such as silicon or epoxy. In addition, a top surface of the resin member 35 may have a flat surface, a concave surface or a convex surface and a lens can be attached onto the resin member 35.

At least one type of phosphors can be added to the resin member 35. The phosphor may include a yellow phosphor or a yellow/red phosphor. For the purpose of convenience of explanation, the following description will be made on the assumption that the light emitting diodes 31 and 32 are blue LED chips, and the phosphor is a yellow phosphor or a yellow/red phosphor.

The light emitting device according to the embodiment may include a protective device for protecting the light emitting diodes 31 and 32, but the embodiment is not limited thereto.

The light emitting diodes 31 and 32 have the rank which is the reference for dividing the light emitting diodes 31 and 32 into groups or units. In detail, after the light emitted from the light emitting diodes 31 and 32 has been measured, the light emitting diodes 31 and 32 are divided into groups or units based on the chromatic rank, luminous rank and peak wavelength rank according to the characteristics of the light emitted from the light emitting diodes 31 and 32.

The light emitting device 10 includes a plurality of light emitting diodes 31 and 32 which emit the spectrums having the same color wavelength band. The light emitting diodes 31 and 32 may represent different peak wavelengths. For instance, the light emitting diode 31 represents the first main peak which is closer to the short wavelength than to the central wavelength of the first color band, and the light emitting diode 32 represents the second main peak which is closer to the long wavelength than to the central wavelength of the first color band. Hereinafter, the light emitting diode that emits the wavelength spectrum of blue light will be described as an example. The wavelength band of the blue light is about 380 nm to about 500 nm, preferably, about 380 nm to about 480 nm, more preferably, about 440 nm to about 460 nm. The short wavelength of the blue wavelength is about 380 nm or less, preferably, about 440 nm or less. The long wavelength of the blue wavelength is about 500 nm or above, preferably, about 480 nm or above, more preferably, about 460 nm or above.

The difference in wavelength between the first main peak of the first light emitting diode 31 and the second main peak of the second light emitting diode is about 75% or more within the wavelength range of one color. The difference in wavelength between the first main peak of the first light emitting diode 31 and the second main peak of the second light emitting diode can be represented as the difference between the central peak of the first main peak and the central peak of the second main peak. In addition, the difference in wavelength between the first main peak of the first light emitting diode 31 and the second main peak of the second light emitting diode can be represented as the actual wavelength difference, which is obtained by subtracting the second main peak from the first main peak.

When the wavelength range of the blue light is about 440 nm to about 460 nm, the difference is about 75% or above of 20 nm, which is obtained by subtracting 440 nm from 460 nm, that is, about 15 nm or above. For instance, if the wavelength range of the green light is about 525 nm to about 535 nm, the difference of 75% is about 7.5 nm or above. The wavelength range of the red light is about 615 nm to about 630 nm, so the difference of 75% is about 11.25 nm or above. The wavelength range of the yellow light is about 510 nm to about 525 nm, so the difference of 75% is about 11.25 nm or above.

The main peak may include the dominant wavelength or the FWHM (full width at half maximum).

Figure 3:
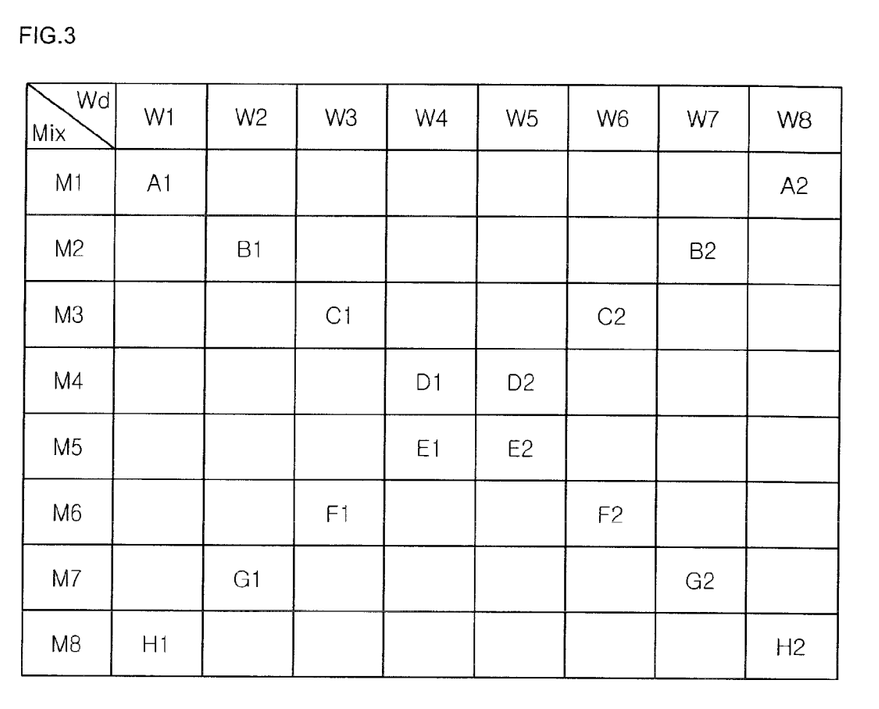
FIG. 3 is a table showing an example of mixing of main peaks between light emitting devices according to the embodiment.

FIG. 3 is a table showing an example of mixing of main peaks between light emitting devices according to the embodiment.

Referring to FIG. 3, in the spectrum of the light emitting diode, the blue wavelength band is in the range of about 440 nm to about 460 nm. For instance, the main peak of the blue wavelength can be obtained in the range of W1 to W8. Each main peak in W1 to W8 can be obtained at an interval of about 0.5 nm to about 3.5 nm, but the embodiment is not limited thereto. If each main peak is obtained at the interval of 2.5 nm in the wavelength spectrum, W1 is about 440 nm to about 442.5 nm, W2 is about 442.5 nm to about 445 nm, W3 is about 445 nm to about 447.5 nm, W4 is about 447.5 nm to about 450 nm, W5 is about 450 nm to about 452.5 nm, W6 is about 452.5 nm to about 455 nm, W7 is about 455 nm to about 457.5 nm, and W8 is about 457.5 nm to about 460 nm.

The peak wavelengths of two light emitting diodes can be mixed with each other in the form of M1 to M8 by using A1 to A8 and A2 to H2. The embodiment may include two light emitting diodes (for instance, M1 and M8) representing great difference of the main peak.

The first and second light emitting diodes 31 and 32 of the embodiment may be realized by mixing A1 and A2 or H2 and H1. In addition, the difference between the central peaks of the first and second light emitting diodes 31 and 32 may be about 10 nm or above, preferably, about 15 nm to about 20 nm.

Figure 4:
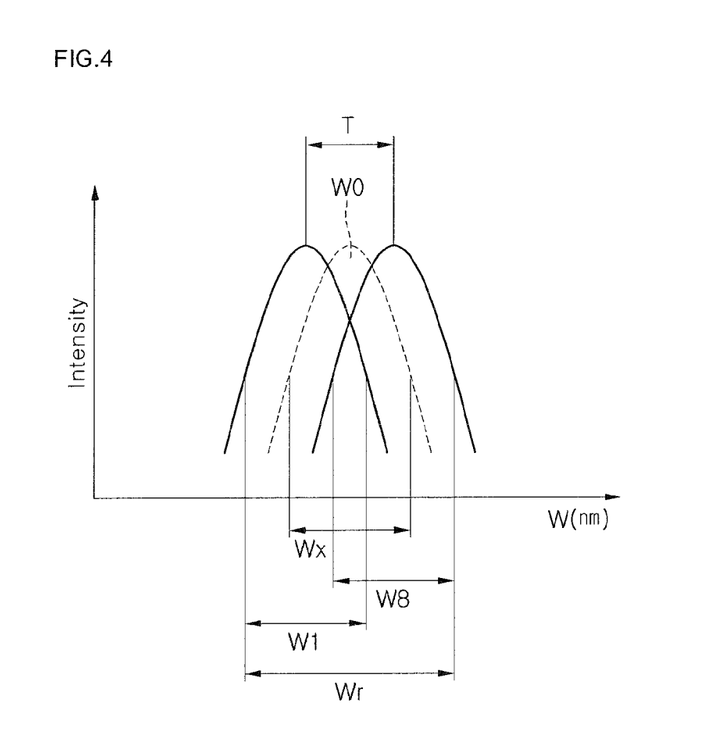
FIG. 4 is a graph showing an example of mixing of main peaks between light emitting devices shown in FIG. 1.

According to the embodiment, as shown in FIG. 4, for instance, the main peaks of the first and second light emitting diodes having the range of W1 and W8 are mixed so that the main peak Wx having the central peak W0 is represented. The central peak W0 is a peak in a set. For instance, when the central peak W0 is 450 nm, the central peak W0 is in the range of 450 nm±1.25 nm. The first main peak W1 of the first light emitting diode is a short wavelength spaced apart from the central peak (for instance, 450 nm) by 37.5% or more, and the second main peak W8 of the second light emitting diode is a long wavelength spaced apart from the central peak (for instance, 450 nm) by 37.5% or more. Since 37.5% is 7.5 nm, the first and second main peaks W1 and W8 are spaced apart from the central peak W0 by 7.5 nm, respectively. That is, in the wavelength range spaced apart from the central peak by 75%, the first main peak W1 of the first light emitting diode is in the range of about 440 nm to about 442.5 nm and the second main peak W8 of the second light emitting diode is in the range of about 457.5 nm to about 460 nm.

The difference T between the first main peak W1 of the first light emitting diode and the second main peak W8 of the second light emitting diode corresponds to the difference between the central peak of the first main peak and the central peak of the second main peak. The difference T between the central peaks of the first and second main peaks W1 and W8 is about 75% based on the wavelength range WR of the first color band. In detail, the central peaks of the first and second main peaks W1 and W8 are spaced apart from the central peak W0 of the first color band by about 37.5% in opposition to each other.

The first main peak W1 of the first light emitting diode can be mixed with the second main peak W8 of the second light emitting diode in such a manner that the main peak Wx can be represented as the central peak in the set. The central peak may be a peak wavelength Wp or the actual central wavelength of the main peak.

Figure 5:
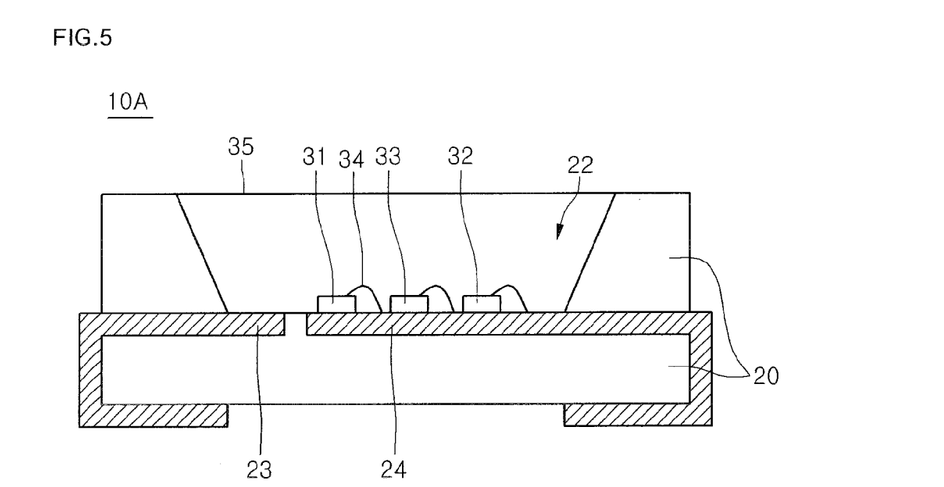
FIG. 5 is a side sectional view showing a light emitting device package according to the second embodiment.

In addition, according to the second embodiment, at least three light emitting diodes 31, 32 and 33 can be disposed in a light emitting device 10A as shown in FIG. 5. The light emitting diodes 31, 32 and 33 may include first and second light emitting diodes 31 and 32 having the spectrum with the same color and representing the relatively great difference in wavelengths, and a third light emitting diode 33 having a peak wavelength between main peaks of the first and second light emitting diodes 31 and 32. In the light emitting device 10A, the first light emitting diode 31 is disposed at one side of the cavity 22, the second light emitting diode 32 is disposed at the other side of the cavity 22, and the third light emitting diode 33 is disposed at the center of the cavity 22. For instance, the first and second light emitting diodes 31 and 32 are aligned such that they have the greatest difference of the wavelength in the blue spectrum, and the third light emitting diode 33 has the third main peak, which is equal or approximate to the average of the central peaks of the first and second light emitting diodes 31 and 32. This wavelength range is about 0.5 nm to about 2.5 nm. The third peak wavelength has a value between the first and second peak wavelengths.

The first to third light emitting diodes 31 to 33 may be prepared as the combination of W1/W8/W4 or W1/W8/W5 in the table shown in FIG. 3. In the light emitting device 10A, the first to third light emitting diodes 31 to 33 may be variously arranged such that they represent the peak wavelength approximate to the central peak of a desired color band. The central peak is the peak wavelength of each color spectrum.

For instance, if the peak wavelength is 450 nm, the central peak is in the range of 450+1.25 nm.

In addition to the light emitting diodes representing the blue wavelength spectrum, at least two light emitting diodes representing the green wavelength spectrum or the red wavelength spectrum can be mixed as described above.

Figure 6:
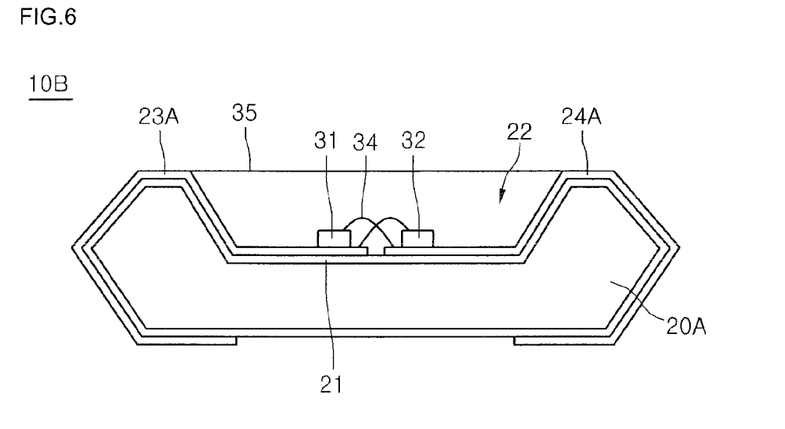
FIG. 6 is a side sectional view showing a light emitting device package according to the third embodiment.

FIG. 6 is a side sectional view showing a light emitting device according to the third embodiment. Referring to FIG. 6, the light emitting device 10B includes an insulating layer 21 formed on a surface of a conductive body 20A, a plurality of lead electrodes 23A and 24A coated on the conductive body 20A, and a plurality of light emitting diodes 31 and 32 disposed on the lead electrodes 23A and 24A. For instance, the conductive body 20A can be formed by adding N type or P type conductive dopant to a silicon wafer.

According to the third embodiment, a protective device can be formed on the body 20A to protect the light emitting diodes 31 and 32, or the light emitting diodes 31 and 32 can be directly formed on the body, such as a silicon wafer, but the embodiment is not limited thereto.

Figure 7:
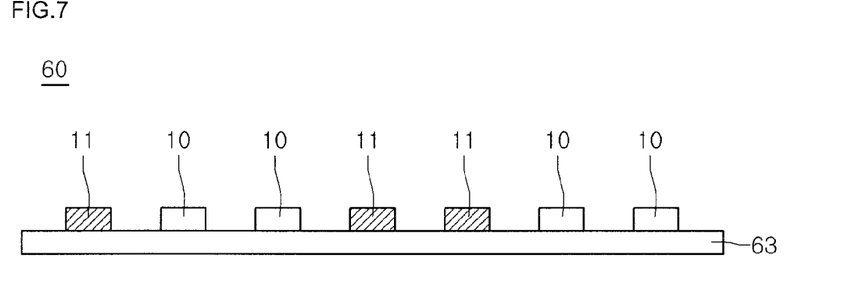
FIG. 7 is a view showing a light emitting module according to the fourth embodiment.

FIG. 7 is a view showing a light emitting module according to the fourth embodiment.

Referring to FIG. 7, the light emitting module 60 includes first light emitting devices 10 according to the first embodiment and second light emitting devices 11 having wavelength combination different from that of the first light emitting devices 10. The first and second light emitting devices 10 and 11 are arrayed on a board 63. The board 63 may selectively include a substrate having a metal plate, a resin PCB, a ceramic substrate or a flexible substrate.

In detail, the first and second light emitting devices 10 and 11 are alternately arrayed on the board 63.

The structure of the first light emitting device 10 has been described with reference to FIG. 1, and the second light emitting device 11 may include at least one of M2 to M7 shown in the table of FIG. 3. According to the embodiment, the number of light emitting diodes disposed in the first light emitting device 10 may be different from the number of light emitting diodes disposed in the second light emitting device 11, but the embodiment is not limited thereto. In addition, according to the embodiment, only the light emitting devices 10 shown in FIG. 1 can be arrayed on the board 63. Further, according to the embodiment, the light emitting devices shown in FIG. 5 or 6 can be selectively used in addition to the light emitting devices shown in FIG. 1.

The light emitting module 60 shown in FIG. 7 includes a plurality of light emitting devices 10 and 11 which are arranged such that the difference of the central peak between the light emitting devices 10 and 11 is within 2.5 nm.

Figure 8:
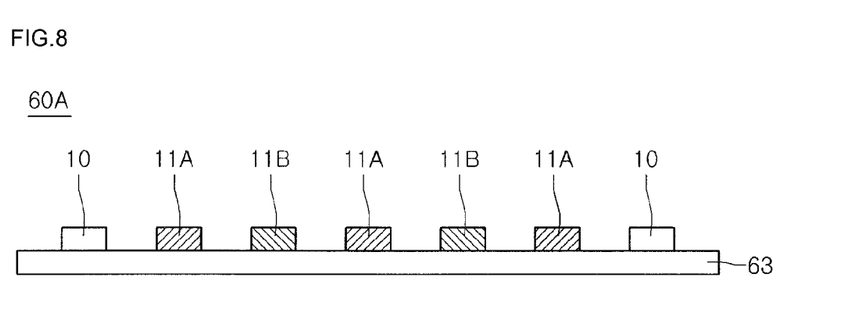
FIG. 8 is a view showing a light emitting module according to the fifth embodiment.

In addition, as shown in FIG. 8, a light emitting module 60A may include first light emitting devices 10 having wavelength combination as shown in FIG. 1 and light emitting devices 11A and 11B having wavelength combination different from that of the light emitting devices 10. For instance, the light emitting devices 11A and 11B may be arrayed by selecting at least two of M2 to M7 shown in the table of FIG. 3.

The light emitting module 60A shown in FIG. 8 includes a plurality of light emitting devices 10, 11A and 11B which are arranged such that the difference of the peak wavelength among the light emitting devices 10, 11A and 11B is within 2.5 nm.

According to the fifth embodiment, as shown in FIGS. 7 and 8, the difference of the central peak between two different light emitting devices in the light emitting module 60 or 60A is within 2.5 nm, so that the color stain caused by the difference of the color sensitivity in a set, such as the light unit, can be prevented.

Figure 9:
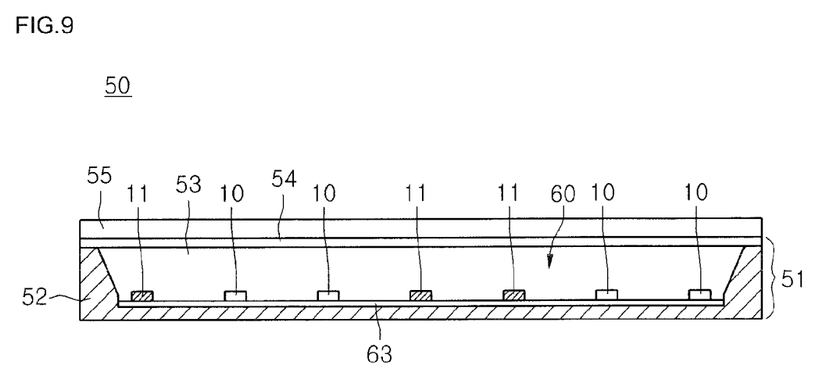
FIG. 9 is a side sectional view showing a display device according to the sixth embodiment.

FIG. 9 is a sectional view showing a display device according to the sixth embodiment.

Referring to FIG. 9, the display device 50 includes a bottom cover 52, a plurality of light emitting devices 10 and 11 formed on a board 63, an optical sheet 54 and a display panel 55. The board 63, the bottom cover 52, and the optical sheet 54 may serve as a light unit 51.

The bottom cover 52 includes a recess 53 having an open top surface. An inner wall of the recess is inclined. The bottom cover 52 and a lateral side of the bottom cover 52 may be prepared as separate structures, but the embodiment is not limited thereto.

At least one board 63 is disposed on the bottom cover 52. The first and second light emitting devices 10 and 11 are arrayed on the board 63. According to the embodiment, the first and second light emitting devices 10 and 11 are arrayed on the board 63 such that the difference of the central peak between the first and second light emitting devices 10 and 11 is within 2.5 nm. Since the difference of the peak between the light emitting devices 10 and 11 is narrowed, the color stain or the color sensitivity variation caused by the light emitting devices 10 and 11 can be reduced.

The optical sheet 54 may include at least one of a diffusion sheet, a horizontal/vertical prism sheet and a brightness enhancement sheet. The diffusion sheet diffuses the incident light, the horizontal/vertical prism sheet concentrates the incident light onto the display region, and the brightness enhancement sheet improves the light efficiency by reusing the wasted light.

For instance, the display panel 55 may be an LCD panel including first and second substrates and a liquid crystal layer interposed between the first and second substrates. The first substrate may include a color filter array substrate and the second substrate may include a TFT array substrate, or vice versa. However, the embodiment is not limited to the above display panel, but various modifications are possible. A polarizing plate can be attached to at least one surface of the display panel, but the embodiment is not limited thereto.

Figure 10:
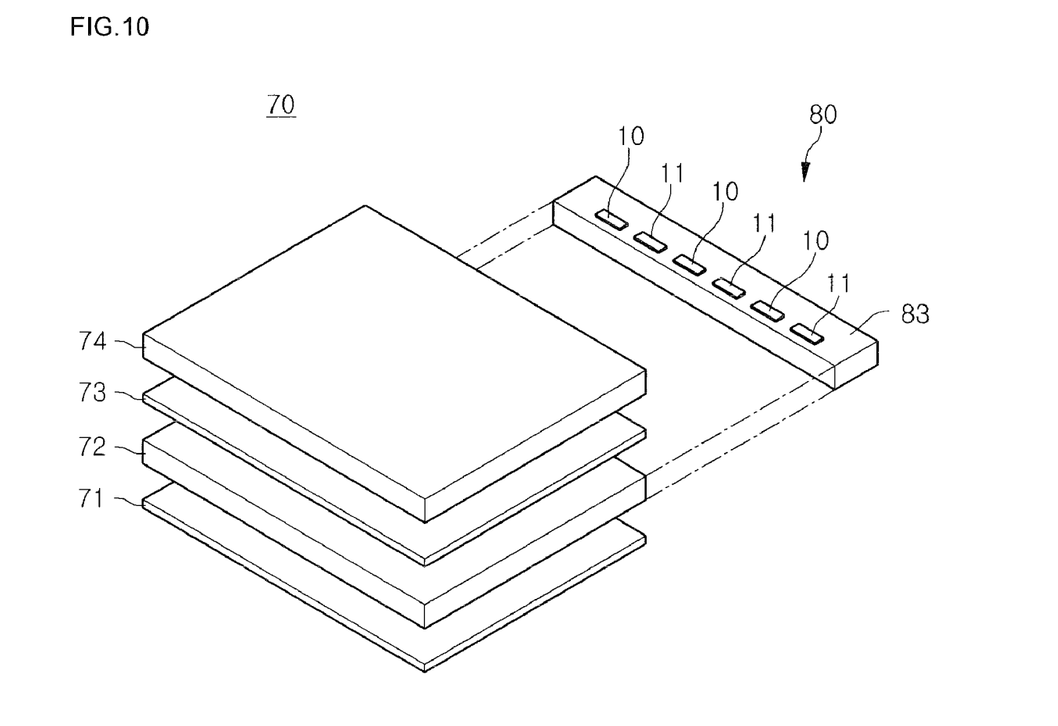
FIG. 10 is an exploded perspective view showing a display device according to the seventh embodiment.

FIG. 10 is an exploded perspective view showing a display device according to the seventh embodiment.

Referring to FIG. 10, the display device 70 includes a board 83, a light emitting module 80 including light emitting devices 10 and 11, a reflective plate 71, a light guide plate 72, an optical sheet 73, and a display panel 74. The light emitting module 80, the reflective plate 71, the light guide plate 72, and the optical sheet 73 may serve as a light unit. The light unit can be protected by a bottom cover or a bottom chassis.

The light emitting module 80 includes the light emitting devices 10 and 11 representing the difference of the peak wavelength within 2.5 nm. At least one of the light emitting devices 10 and 11 has the wavelength combination as described above.

The light guide plate 72 is disposed at one side of the light emitting module 80, the reflective plate 71 is disposed below the light guide plate 72 and the optical sheet 73 is disposed above the light guide plate 72. The light guide plate 72 may be spaced apart from the light emitting devices 10 and 11 by a distance of 0.5 mm or less. The light guide plate 72 is made from a PC material or a PMMA (poly methyl methacrylate) material, but the embodiment is not limited thereto.

The reflective plate 71 reflects the light leaked from the light guide plate 72, and the optical sheet diffuses or collects the light incident through the light guide plate 72 such that the light can be irradiated to the display panel.

The light emitted from the light emitting module 80 is incident into the light guide plate 72 and the light guide plate 72 guides the light incident from the light emitting module 80 over the whole area of the display device so that the surface light is emitted. The optical sheet 73 is disposed above the light guide plate 72. The light guide plate 72 and the optical sheet 73 may be defined as an optical member.

The optical sheet 73 may include at least one of the diffusion sheet, the horizontal/vertical prism sheet, and the brightness enhancement film. For instance, the display panel 74 may be prepared as an LCD panel.

Figure 11:
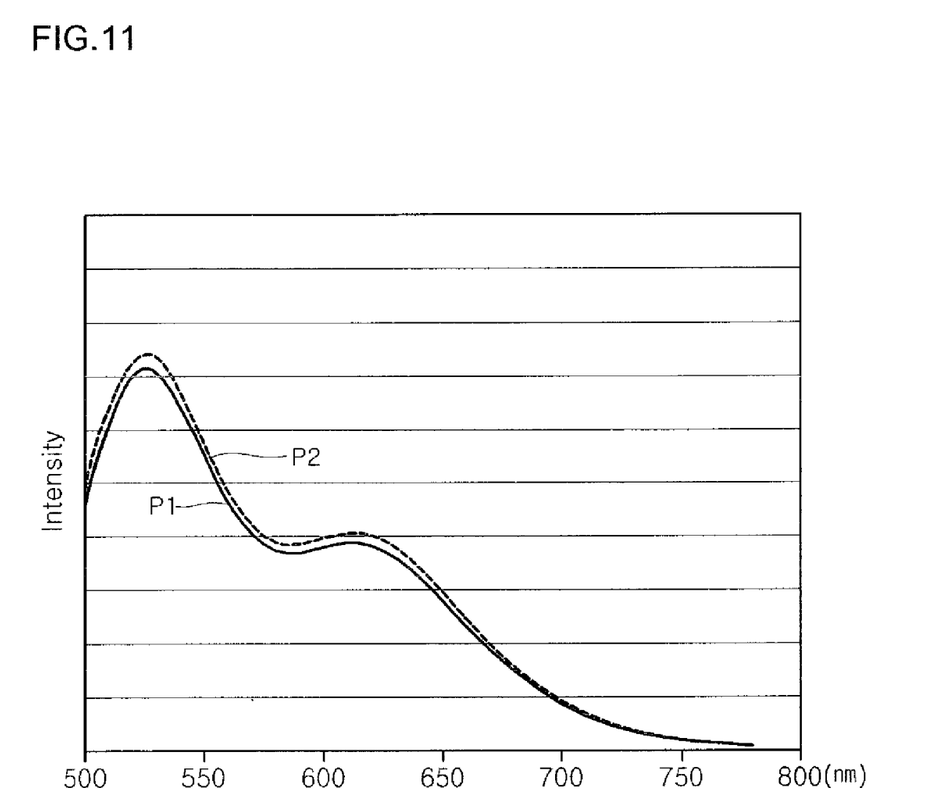
FIG. 11 is a graph showing spectrums of a plurality of light emitting devices in a light unit according to the embodiment.

FIG. 11 is a graph showing spectrums of a plurality of light emitting devices in a light unit according to the embodiment. The spectrums shown in the graph are obtained from two light emitting devices and represent wavelengths of green and red phosphors excited by the light emitted from the blue light emitting diode.

As shown in FIG. 11, the spectrums P1 and P2 of the two light emitting devices represent the main peaks of the green and red phosphors exited by the light emitted from the blue light emitting device. If the difference of the spectrum peak between two light emitting devices is within 2.5 nm, the difference of the intensity of the main peak between the green color and the red color may rarely occur in the spectrums P1 and P2. That is, according to the embodiment, the difference of the peak between the light emitting diodes is set within the critical range in the light emitting device array, so that the difference of the excited wavelength of the phosphor, which is excited by absorbing the light emitted from the light emitting diode, can be reduced. In detail, the difference of the excited wavelength caused by the light emitting diodes and the phosphor can be reduced, so that the variation of the color sensitivity, such as the reddish or the color stain caused by the difference of the main peaks, can be reduced in the light unit.

The embodiment can reduce the difference of the color sensitivity between light emitting diodes. The embodiment can reduce the difference of the color sensitivity in the set caused by the light emitting device array, so that the color stain or the abnormal color can be reduced. The embodiment can provide the light unit having the uniform color distribution.

Figure 12:
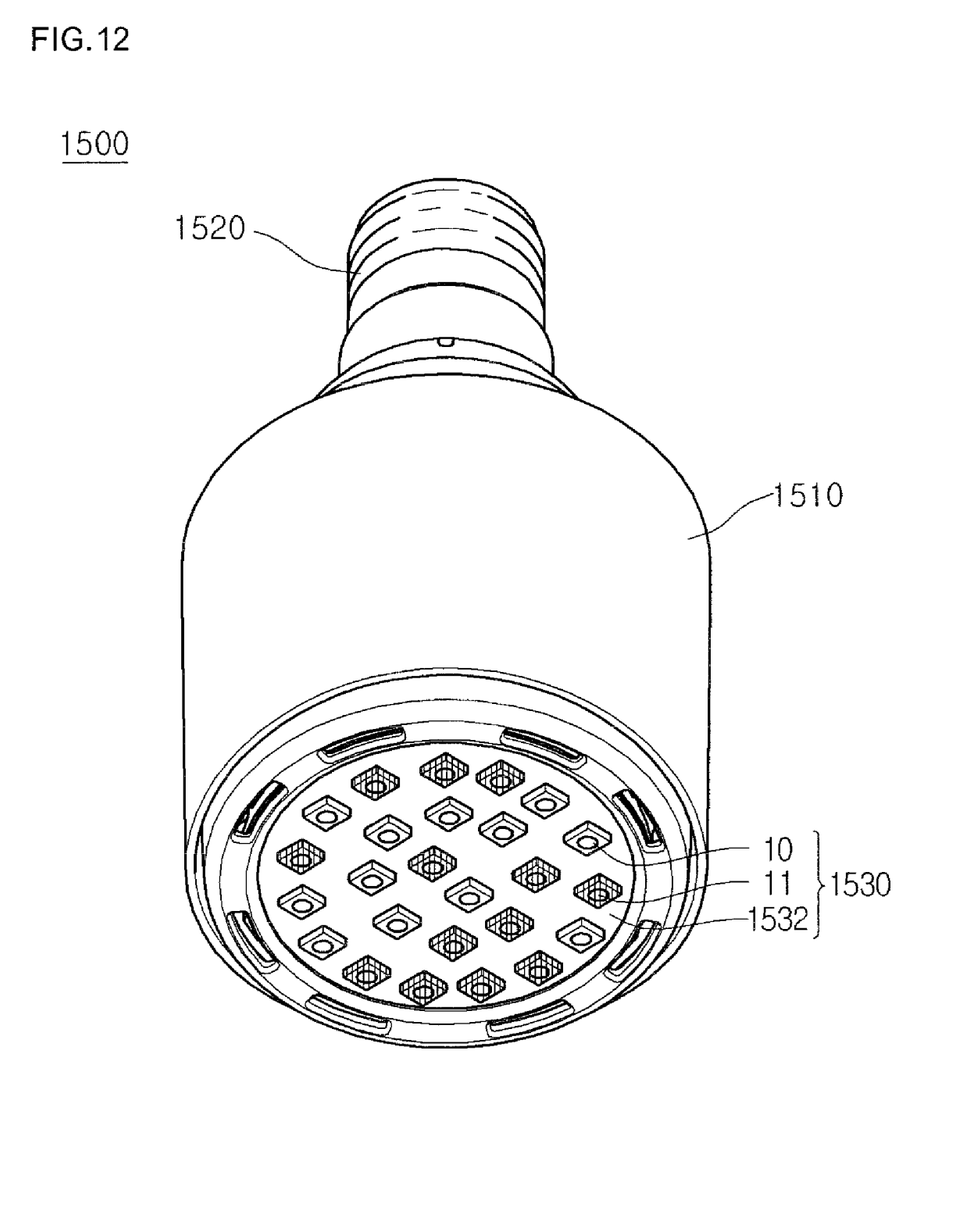
FIG. 12 is a perspective view showing a lighting unit including a light emitting device according to the embodiment.

FIG. 12 is a perspective view showing a lighting device according to the embodiment.

Referring to FIG. 12, the lighting device 1500 includes a case 1510, a light emitting module 1530 disposed in the case 1510, and a connection terminal 1520 disposed in the case 1510 to receive power from an external power source.

Preferably, the case 1510 includes a material having superior heat dissipation property. For instance, the case 1510 includes a metallic material or a resin material.

The light emitting module 1530 may include a board 1532 and light emitting devices 10 and 11 according to the embodiment disposed on the board 1532. The light emitting devices 10 and 11 according to the embodiment have main peaks which are different from each other in the same color band. The light emitting devices 10 and 11 are spaced apart from each other or arranged in the form of a matrix.

The board 1532 includes an insulating member printed with a circuit pattern. For instance, the board 1532 includes a PCB, an MCPCB, an FPCB, a ceramic PCB, and an FR-4 substrate.

In addition, the board 1532 may include a material that effectively reflects the light. A coating layer can be formed on the surface of the board 1532. At this time, the coating layer has a white color or a silver color to effectively reflect the light.

At least one light emitting device can be disposed on the board 1532. Each light emitting device 10 or 11 may include at least one LED (light emitting diode) chip. The LED chip may include an LED that emits the light of visible ray band having red, green, blue or white color and a UV (ultraviolet) LED that emits UV light.

The light emitting devices 10 and 11 of the light emitting module 1530 can be variously combined to provide various color sensitivity and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

The light emitting device according to the embodiment can emit lights having various colors, so the light emitting device can be used as a light source in various products such as a lighting indicator, a character indicator, and an image display. In addition, the lighting device may include a lighting lamp, a signal lamp, a headlight of a vehicle, and an electric signboard.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body;
a first light emitting diode for emitting a light having a first main peak in a wavelength range of a first color;
a second light emitting diode for emitting a light having a second main peak in the wavelength range of the first color; and
a plurality of lead electrodes electrically connected to at least one of the first and second light emitting diodes on the body, wherein the first main peak of the first light emitting diode and the second main peak of the second light emitting diode have a wavelength difference of at least 75% based on the wavelength range of the first color,
wherein the first main peak of the first light emitting diode and the second main peak of the second light emitting diode have the wavelength difference of at least 15 nm based on the wavelength range of the first color,
wherein the first and second light emitting diodes emit a blue light, and
wherein the first main peak of the first light emitting diode is in a range of 440 nm to 442.5 nm and the second main peak of the second light emitting diode is in a range of 457.5 nm to 460 nm.

2. The light emitting device of claim 1, wherein the first main peak of the first light emitting diode is shifted in a short wavelength direction by at least 7.5 nm based on a central wavelength of the first color, and the second main peak of the second light emitting diode is shifted in a long wavelength direction by at least 7.5 nm based on the central wavelength of the first color.

3. The light emitting device of claim 1, further comprising a cavity formed at an upper portion of the body, wherein the first and second light emitting diodes and the lead electrodes are disposed in the cavity.

4. The light emitting device of claim 1, further comprising a resin member covering the first and second light emitting diodes.

5. The light emitting device of claim 4, wherein the resin member includes at least one of a green phosphor, a yellow phosphor, and a red phosphor.

6. The light emitting device of claim 1, further comprising a third light emitting diode disposed between the first and second light emitting diodes, wherein a third main peak of a light emitted from the third light emitting diode has a difference within 2.5 nm with respect to an average of the first and second main peaks.

7. A light unit comprising:
a board; and
a plurality of light emitting devices arrayed on the board, wherein at least one first light emitting device of the light emitting devices comprises:
a body;
a first light emitting diode for emitting a light having a first main peak in a wavelength range of a first color;
a second light emitting diode for emitting a light having a second main peak in the wavelength range of the first color; and a plurality of lead electrodes electrically connected to at least one of the first and second light emitting diodes on the body, and
wherein the first main peak of the first light emitting diode and the second main peak of the second light emitting diode have a wavelength difference of at least 75% based on the wavelength range of the first color,
wherein the first main peak of the first light emitting diode and the second main peak of the second light emitting diode have the wavelength difference of at least 15 nm based on the wavelength range of the first color,
wherein the first main peak of the first light emitting diode is in a range of 440 nm to 442.5 nm and the second main peak of the second light emitting diode is in a range of 457.5 to 460 nm.

8. The light unit of claim 7, wherein the light emitting devices include a second light emitting device different from the first light emitting device, and the second light emitting device includes third and fourth light emitting diodes representing a wavelength difference less than 75% based on the wavelength range of the first color.

9. The light unit of claim 8, wherein a difference of a peak wavelength between the first and second light emitting devices is within 2.5 nm.

10. The light unit of claim 7, wherein a difference of a peak wavelength among the light emitting devices is within 2.5 nm.

11. The light unit of claim 7, further comprising at least one of a light guide plate and an optical sheet at one side of the light emitting devices.

12. The light unit of claim 7, wherein the body of the light emitting device includes a cavity, the first light emitting diodes and the lead electrodes are disposed in the cavity, and the light emitting device includes a resin member to cover the first and second light emitting diodes.

13. The light unit of claim 12, further comprising a lens disposed at a light exit side of the light emitting device.

* * * * *